(12) United States Patent
Camuffo

(10) Patent No.: US 11,223,376 B2
(45) Date of Patent: Jan. 11, 2022

(54) FREQUENCY DEPENDENT ENVELOPE TRACKING

(71) Applicant: Apple Inc., Cupertino, CA (US)

(72) Inventor: Andrea Camuffo, Munich (DE)

(73) Assignee: Apple Inc., Cupertino, CA (US)

( * ) Notice: Subject to any disclaimer, the term of this patent is extended or adjusted under 35 U.S.C. 154(b) by 528 days.

(21) Appl. No.: 15/443,260

(22) Filed: Feb. 27, 2017

(65) Prior Publication Data

US 2018/0248570 A1 Aug. 30, 2018

(51) Int. Cl.
| | |
|---|---|
| H04B 1/04 | (2006.01) |
| H03F 1/02 | (2006.01) |
| H03F 3/24 | (2006.01) |
| H03F 3/19 | (2006.01) |
| H03F 3/195 | (2006.01) |

(52) U.S. Cl.
CPC ............. *H04B 1/04* (2013.01); *H03F 1/0216* (2013.01); *H03F 1/0266* (2013.01); *H03F 3/19* (2013.01); *H03F 3/195* (2013.01); *H03F 3/245* (2013.01); *H03F 2200/102* (2013.01); *H03F 2200/451* (2013.01)

(58) Field of Classification Search
CPC ....... H04L 27/00; H04B 1/04; H03F 1/02616; H03F 1/0266; H03F 3/19; H03F 3/195; H03F 3/245
USPC ........................................................ 375/295
See application file for complete search history.

(56) References Cited

U.S. PATENT DOCUMENTS

2004/0122627 A1* 6/2004 Kybett .................. H03F 1/3247
702/189

2011/0316633 A1 12/2011 Tadano
2012/0041701 A1* 2/2012 Hillman, Jr. ........ G01R 13/0254
702/67
2012/0249236 A1* 10/2012 Langer .................. H03F 1/0272
330/127
2013/0082753 A1* 4/2013 Sun .......................... H03L 7/08
327/156
2014/0122067 A1* 5/2014 Kroeker .................. G10L 25/15
704/209

(Continued)

FOREIGN PATENT DOCUMENTS

| EP | 1569330 A1 | 8/2005 |
| EP | 1569359 A1 | 8/2005 |

OTHER PUBLICATIONS

International Search Report dated Apr. 11, 2018 for International Application PCT/US2018/015413.

*Primary Examiner* — Kevin M Burd
(74) *Attorney, Agent, or Firm* — Eschweiler & Potashnik, LLC

(57) ABSTRACT

An envelope tracking system includes an instantaneous amplitude circuitry, an instantaneous frequency circuitry, and a two-dimensional (2D) bias voltage selection circuitry. The instantaneous amplitude circuitry is configured to determine an instantaneous amplitude of a transmit signal. The instantaneous frequency circuitry is configured to determine an instantaneous frequency of the transmit signal. The two-dimensional (2D) bias voltage selection circuitry is configured to determine a bias voltage based on both the instantaneous amplitude and the instantaneous frequency of the transmit signal, and control power supply circuitry to supply the determined bias voltage to a power amplifier that is configured to amplify the transmit signal.

20 Claims, 4 Drawing Sheets

(56) References Cited

U.S. PATENT DOCUMENTS

2015/0280675 A1\* 10/2015 Langer ................ H03G 3/3042
                                                    455/127.2
2015/0326327 A1   11/2015 Carlsson \* cited by examiner

FREQUENCY DEPENDENT ENVELOPE TRACKING

FIELD

The present disclosure relates to the field of wireless transmitters and in particular to methods and apparatus for improving the efficiency of a power amplifier in a transmit chain of a transmitter.

BACKGROUND

Envelope tracking is a technique by which the bias or supply voltage (e.g., $V_{CC}$) and current (hereinafter reference only to bias voltage will be made for simplicity purposes) of a power amplifier in a transmit chain of a transmitter is controlled based on the amplitude of the transmit signal being amplified by the power amplifier. The idea is to operate the power amplifier close to saturation during modulation peaks and to lower the supply voltage when the instantaneous amplitude signal is low, thereby boosting the efficiency of the power amplifier.

BRIEF DESCRIPTION OF THE DRAWINGS

Some examples of circuits, apparatuses and/or methods will be described in the following by way of example only. In this context, reference will be made to the accompanying figures.

DETAILED DESCRIPTION

Figure 1:
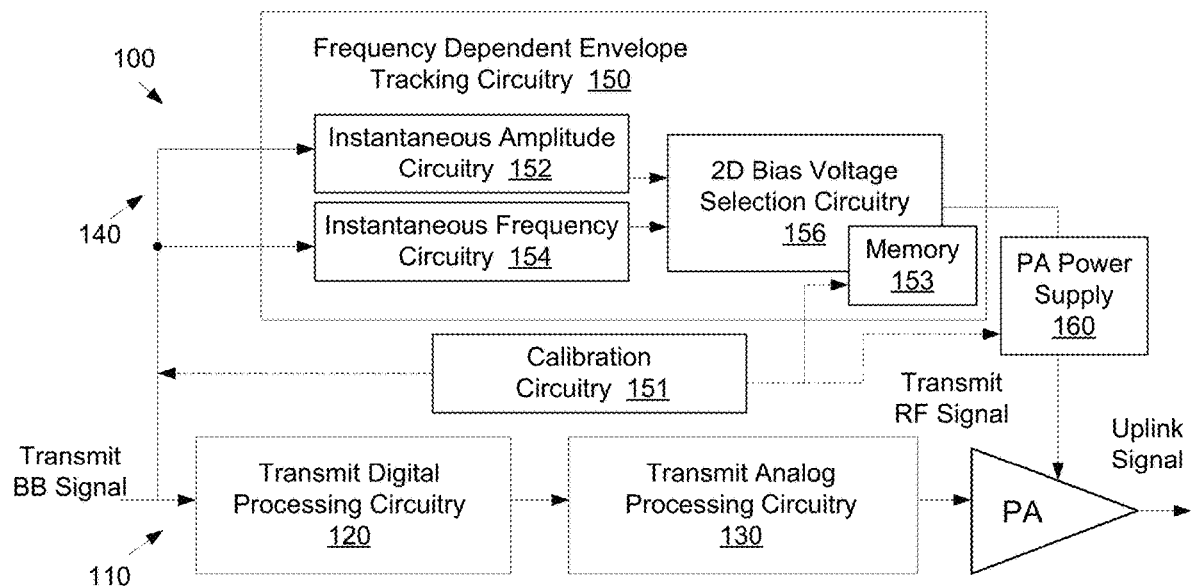
FIG. 1 illustrates an exemplary transmitter architecture that includes frequency dependent envelope tracking circuitry configured to control bias voltage based on both instantaneous amplitude and instantaneous frequency of the transmit signal.

Some transmitters that employ envelope tracking techniques follow so called isogain curves that maintain the gain of the power amplifier (PA) at a constant value across a range of bias voltages and transmit signal amplitudes. An isogain curve maps an instantaneous PA bias voltage that will provide the desired PA gain at each of several amplitudes of the transmit signal. A fast direct current—direct current (DCDC) converter is used to supply the bias voltage specified by the isogain curve to the PA. An isogain curve is often stored in the form of an isogain table that has a column for transmit signal amplitude and a column for the corresponding bias voltage. Selected points along the isogain curve are stored in the table. The isogain curves may be calibrated on a per-device basis during production to characterize individual PAs. Each isogain curve is valid at a specific frequency only, meaning that the transmitter will be calibrated on several channels to generate several channel specific-isogain curves. A different isogain curve or table is loaded for use when the transmitter's channel is changed or a resource block allocation is modified.

Envelope tracking based on frequency specific isogain curves is acceptably efficient with narrowband signals. However, the performance of envelope tracking systems deteriorates when used with wideband signals. This is partly due to the fact that each isogain curve is characterized for a single calibration frequency, and is most valid around the calibration frequency, but during device operation the modulation performed by the PA spreads over a range of different frequencies. Future wireless systems may utilize wider bandwidths of 60 or 80 MHz, which may exacerbate this problem.

The systems, devices, and methods described herein perform "frequency based" envelope tracking that considers both instantaneous amplitude and instantaneous frequency of the transmit signal. Rather than frequency-specific isogain curves, an "isogain surface" is defined that maps a combination of instantaneous amplitude and instantaneous frequency to instantaneous PA bias voltage. The isogain surface is used to select an instantaneous bias voltage for the PA.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates a transmitter architecture 100 that includes an exemplary transmitter chain 110 and an exemplary envelope tracking system 140. The transmitter chain processes a digital baseband transmit signal to generate a radio frequency (RF) transmit signal. The RF transmit signal is amplified by a PA to generate an uplink signal that is transmitted by an antenna (not shown). As will be described with reference to FIG. 2, an exemplary transmit chain 110 includes transmit digital processing circuitry 120 that operates on the digital baseband transmit signal to convert the signal into amplitude and phase components. The amplitude and phase components are converted into the RF transmit signal by transmit analog processing circuitry 130.

The envelope tracking system 140 includes frequency dependent envelope tracking (ET) circuitry 150 that controls a power supply 160 to supply a selected bias voltage to the PA. The frequency dependent ET circuitry 150 may output a control word or voltage that communicates the desired bias voltage or a bias voltage setting to the power supply 160. Thus, the frequency dependent ET circuitry 150 may not generate the bias voltage itself or even a voltage of similar magnitude, but may rather generate a signal that communicates, in some way, the selected bias voltage to the power supply 160, which in turn generates or supplies the selected bias voltage for the PA.

The frequency dependent ET circuitry 150 includes an instantaneous amplitude circuitry 152, and instantaneous frequency circuitry 154, and a two-dimensional (2D) bias voltage selection circuitry 156. The instantaneous amplitude circuitry 152 is configured to determine an instantaneous amplitude of the transmit signal. The instantaneous frequency circuitry 154 configured to determine an instantaneous frequency of the transmit signal. The instantaneous frequency circuitry 154 measures or otherwise evaluates the transmit signal itself to determine the instantaneous frequency, which may be different from a center frequency of a channel in which the transmitter is operating. This "determining" of the instantaneous frequency is to be contrasted with other ET systems that simply load and read a frequency specific isogain curve or table that is specific to a channel or resource block allocation that is in use by the transmitter.

The 2D bias voltage selection circuitry 156 is configured to select a bias voltage based on both the instantaneous amplitude and the instantaneous frequency of the transmit signal and control the power supply circuitry 160 to supply the selected bias voltage to the PA. In this manner, rather than just being dependent on the instantaneous amplitude of the transmit signal, the bias voltage supplied by power supply is dependent on both the instantaneous amplitude and the instantaneous frequency of the transmit signal.

Figure 1A:
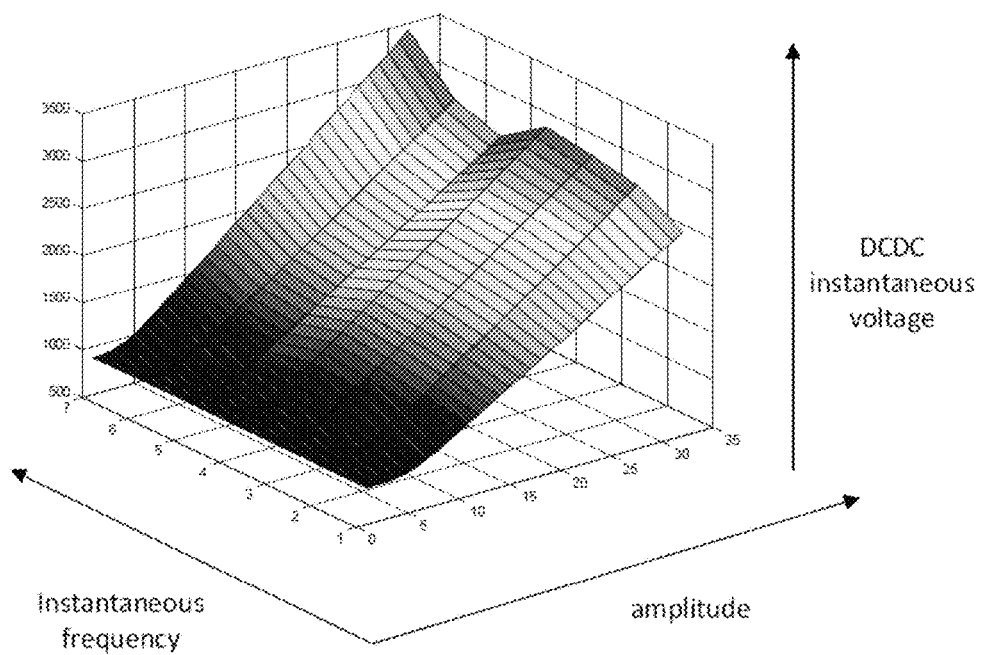
FIG. 1A illustrates an exemplary isogain surface.

FIG. 1A illustrates a three dimensional isogain surface that captures the relationship between combinations of instantaneous amplitude and the instantaneous frequency to an instantaneous bias voltage that will provide the desired PA gain. This three dimensional surface is to be contrasted with the two dimensional frequency specific isogain curves used by other ET systems.

Returning to FIG. 1, in one example, the envelope tracking system 140 also includes a memory 153 configured to store an isogain lookup table (LUT). The LUT is accessed by the 2D bias voltage selection circuitry to select a bias voltage. The envelope tracking system 140 also includes a calibration circuitry 151 configured to populate the LUT during a calibration operation performed during manufacturing. The calibration circuitry 151 is configured to supply a test signal that varies in amplitude and frequency to the frequency dependent envelope tracking circuitry 150. For each of at least two combinations of amplitude value and frequency value, the calibration circuitry controls the power supply circuitry to adjust the bias voltage to obtain a desired PA gain and records, in the LUT (e.g., memory 153), the amplitude value and the frequency value mapped to the value of the bias voltage that obtains the desired gain.

In one example, the calibration circuitry is configured to interpolate, based at least on the amplitude values and the frequency values, several interpolated bias voltage values that are associated with interpolated amplitude values and an interpolated frequency values. The calibration circuitry 151 records, in the LUT, the interpolated amplitude value and the interpolated frequency value mapped to the value of the interpolated bias voltage value. In this manner, a higher granularity LUT may be populated without the delay of adjusting the bias voltage at a larger number of operating points.

Figure 1B:
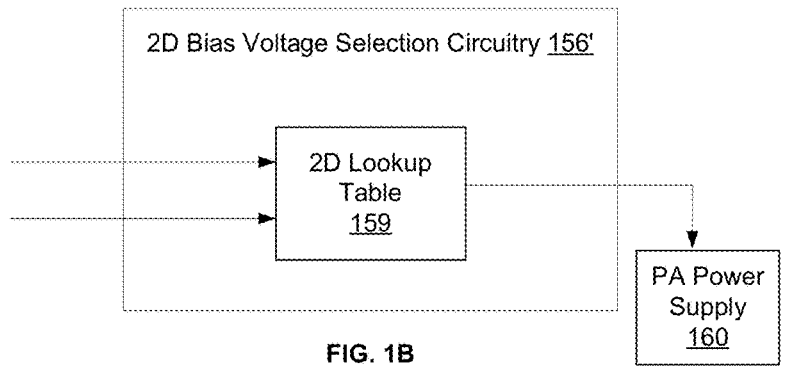
FIG. 1B illustrates an exemplary two dimensional (2D) bias voltage selection circuitry.

FIG. 1B illustrates one exemplary 2D bias voltage selection circuitry 156' that includes memory storing a 2D lookup table (LUT) 159 that maps instantaneous amplitude and instantaneous frequency value pairs to respective instantaneous bias voltages. In this example, the 2D bias voltage selection circuitry 156' is configured to select a bias voltage that is mapped to a present value of the instantaneous amplitude and the instantaneous frequency. The LUT 159 may store data points characterizing an isogain surface. The LUT 159 may have a column for instantaneous amplitude, a column for instantaneous frequency, and a column for bias voltage. The LUT 159 may be populated by the calibration circuitry 151 as descried above.

Figure 1C:
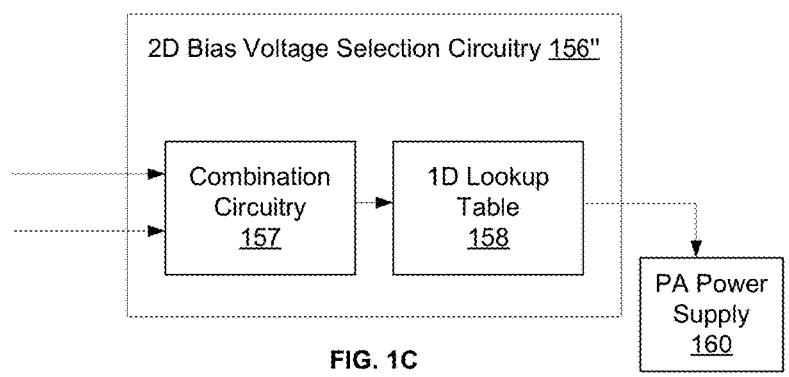
FIG. 1C illustrates another exemplary 2D bias voltage selection circuitry.

FIG. 1C illustrates an another exemplary 2D bias voltage selection circuitry 156" that includes a combination circuitry 157 configured to combine the present value of the instantaneous amplitude and the present value of instantaneous frequency to generate a combination value. For example, combination circuitry 157 may perform an addition and/or multiplication operation on the present value of the instantaneous amplitude and the present value of instantaneous frequency to generate the combination value. The 2D bias voltage selection circuitry 156" includes a memory storing a LUT 158 that maps combination values (rather than amplitude, frequency pairs) to respective instantaneous bias voltages. In this example, the 2D bias voltage selection circuitry is configured to select a bias voltage that is mapped to a present value of the combination value.

Figure 2:
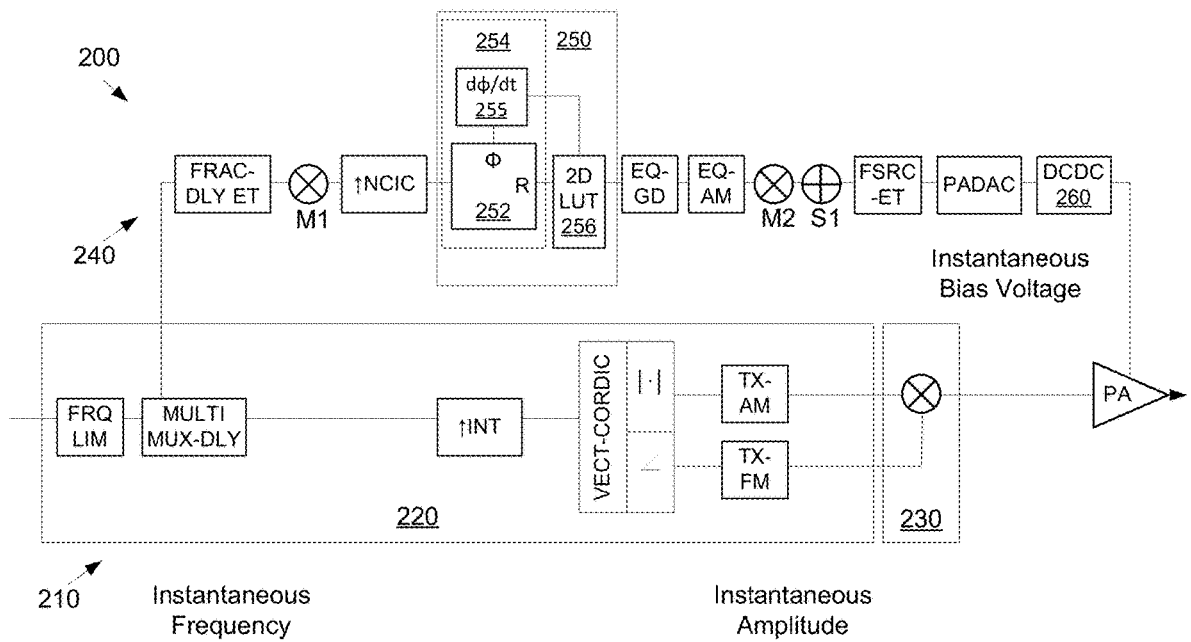
FIG. 2 illustrates an exemplary transmitter architecture that includes frequency dependent envelope tracking circuitry configured to control bias voltage based on both instantaneous amplitude and instantaneous frequency of the transmit signal.

FIG. 2 illustrates an exemplary transmitter architecture 200 in which elements having a similar counterpart in FIG. 1 are assigned a reference numeral that is 100 higher than the counterpart in FIG. 1. The transmitter 200 includes an ET chain or path (e.g., system) 240 for processing the baseband transmit signal. The ET path shares its input with a transmit chain 210 and generates the modulated supply needed at the PA as described with respect to FIG. 1.

A functional block diagram of the ET path is depicted in FIG. 2. The baseband transmit signal is branched off after a frequency limiter via a multipurpose multiplexing (MULTI MUX-DLY) circuitry. This allows the introduction of part of the compensation delay in either the ET path 240 or the TX path 210. A fractional delay block follows for finer time alignment. ET operation is profitable when the current 'invested' in the ET chain is lower than the current saved at the PA. This translates with today's PAs and technology in approximately 10 dB of dynamic from the maximum output power range. In this range the transmitter is operated with a closed loop power regulation which affects the amplitude of the amplitude modulation signal in the TX-AM path (see block 220). Consequently, in order not to miss the alignment between signal's envelope at the input of the PA and the envelope of the power supply 260, an interface is used in the ET path to mimic the amplitude scaling induced by the TX-AM. This function is provided by the multiplier M1.

In order to target the noise limits at the antenna port, a clean supply or bias voltage envelope is needed. To achieve this, a relatively high sampling frequency for the envelope of the baseband signal is used. Therefore an interpolation block is employed (↑NCIC), which interpolates the I and Q signals before the calculation of their amplitude by instantaneous amplitude circuitry 252 (i.e., a Coordinate Rotation Digital Computer (CORDIC) in this example). The CORDIC is configured to compute an amplitude of the transmit signal and to generate an amplitude signal that communicates the computed amplitude. The CORDIC is configured to compute a phase of the transmit signal and to generate a phase signal that communicates the computed phase. It is convenient for the interpolation to be performed just before the CORDIC 252 because the interpolation occurs after the delay and the scaling, and thus slows down the sampling rate and saves current. Also, interpolating before the CORDIC 252 simplifies the interpolation filtering thanks to the bandwidth of the I and Q signals which is lower than the envelope's bandwidth.

Frequency dependent ET circuitry 250 performs a nonlinear transformation on the output of the interpolator to select a bias voltage for the PA based on the instantaneous amplitude and the instantaneous frequency of the output signal of the interpolator. The frequency dependent ET circuitry 250 includes the CORDIC 252, which computes the instantaneous amplitude (R or radius) and instantaneous phase of the output signal of the interpolator. The frequency dependent ET circuitry 250 also includes instantaneous frequency circuitry 254 that includes the CORDIC 252 and a differentiator block 255. The differentiator block 255 is configured to generate an instantaneous frequency signal based on a rate of change of the phase signal output by the CORDIC 252. The instantaneous frequency signal communicates the instantaneous frequency to a 2D bias voltage selection circuitry 256. The 2D bias voltage selection circuitry 256 includes a 2D LUT (see FIG. 1B), which maps the corresponding instantaneous amplitude and the instantaneous frequency values of the interpolator signal's envelope to a PA bias voltage. In another example, the 2D bias voltage selection circuitry 256 includes a 1D LUT (see FIG. 1C) and combination circuitry (not shown in FIG. 2) that derives or calculates a single value from the instantaneous amplitude and the instantaneous frequency.

After the nonlinear transformation induced by the frequency dependent ET circuitry 250, linear correction of the amplitude and phase distortions introduced by the following blocks can be performed. In the illustrated example, amplitude equalization (EQ-AM) and group delay equalization (EQ-GD) are performed independently. This is because it increases flexibility and allows a dedicated correction of the group delay on its own (constancy of the group delay is often one of the limiting requirements for ET). The analog elements that follow (like the PADAC) may be affected during operation by undesired effects like a drift of the gain with temperature and/or a DC offset. In order to compensate for these effects, which are completely independent from what affects the transmit chain in analogy, a multiplier M2 and an adder S2 are present the ET chain 240.

The clock concept of the transmitter 200 provides for a modulated clock to both RFDAC and PADAC (DCO modulated by the PM according to the polar architecture of the TX). All the digital blocks will be provided with an un-modulated clock. Consequently a fractional sample rate converter (FSRC) is used to correctly realize the signal's conversion in between the digital and the analog domain. The PADAC converts the digital information to an analog voltage signal which is then transduced to a modulated supply by a following DC/DC converter 260.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 3:
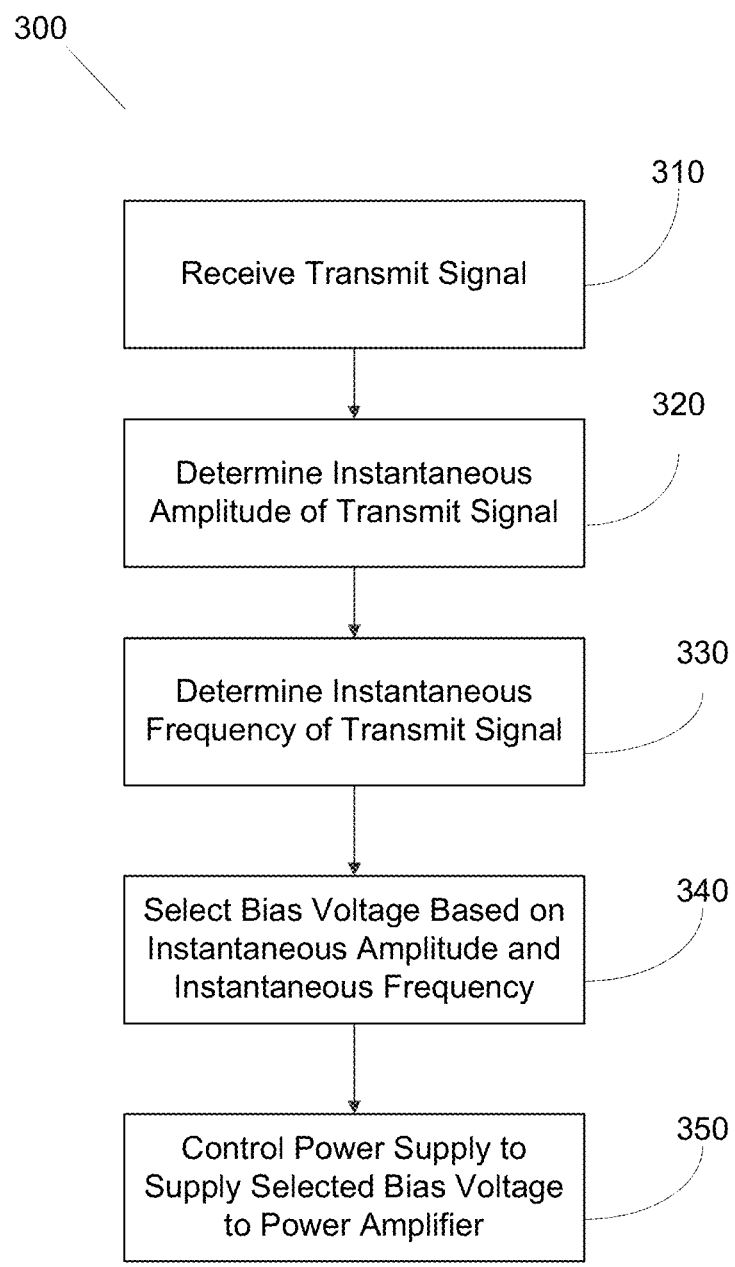
FIG. 3 illustrates a flowchart that outlines an exemplary method for controlling bias voltage based on both instantaneous amplitude and instantaneous frequency of the transmit signal.

FIG. 3 depicts a flowchart outlining one embodiment of a method 300 for controlling a bias voltage of a power amplifier. The method 300 may be performed, for example, by the frequency dependent ET circuitry 150 or 250 of FIGS. 1-2. A transmit signal is received at 310. At 320, the method includes determining an instantaneous amplitude of a transmit signal. At 330, the method includes determining an instantaneous frequency of the transmit signal. The determining includes a direct measurement or analysis of the transmit signal and is not based on a current channel selection or resource block allocation in use by the transmitter. A bias voltage is selected at 340 based on both the instantaneous amplitude and the instantaneous frequency of the transmit signal. At 350, a power supply circuitry is controlled to supply the selected bias voltage to a power amplifier that is configured to amplify the transmit signal.

It can be seen from the foregoing description that the disclosed systems, devices, and methods provide effective envelope tracking over a wide range of frequencies by selecting a bias voltage that is mapped to both an instantaneous amplitude and an instantaneous frequency of a transmit signal.

Figure 4:
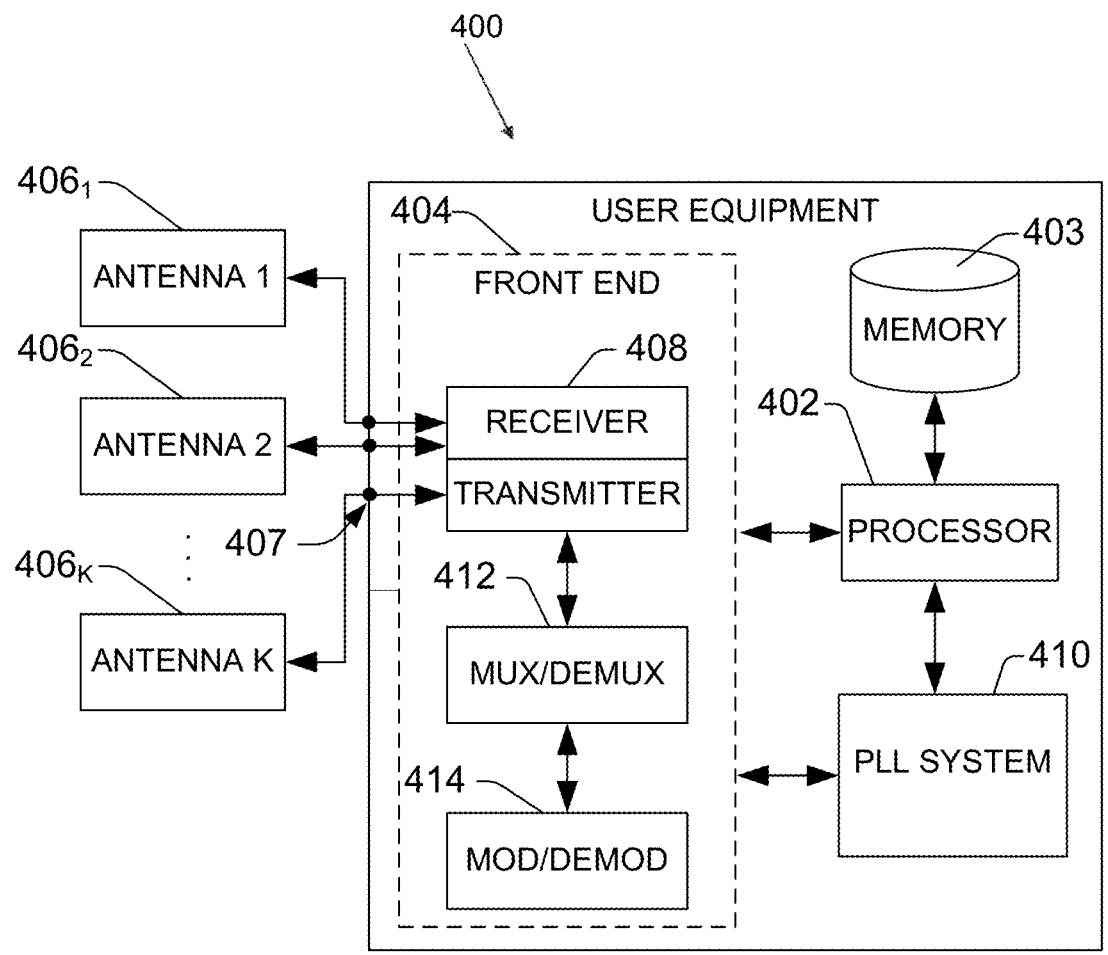
FIG. 4 illustrates an example user equipment device that includes a transmitter front end that includes frequency dependent envelope tracking circuitry in accordance with various aspects described.

To provide further context for various aspects of the disclosed subject matter, FIG. 4 illustrates a block diagram of an embodiment of user equipment 400 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 400 can be utilized with one or more aspects of the frequency dependent envelope tracking circuitry described herein according to various aspects. The user equipment device 400, for example, comprises a digital baseband processor 402 that can be coupled to a data store or memory 403, a front end 404 (e.g., an RF front end, an acoustic front end, or the other like front end) and a plurality of antenna ports 407 for connecting to a plurality of antennas 406 $_1$ to 406 $k$ (k being a positive integer). The antennas 406 $_1$ to 406 $k$ can receive and transmit signals to and from one or more wireless devices such as access points, access terminals, wireless ports, routers and so forth, which can operate within a radio access network or other communication network generated via a network device (not shown).

The user equipment 400 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 404 can include a communication platform, which comprises electronic components and associated circuitry that provide for processing, manipulation or shaping of the received or transmitted signals via one or more receivers or transmitters (e.g. transceivers) 408, a mux/demux component 412, and a mod/demod component 414. The front end 404 is coupled to the digital baseband processor 402 and the set of antenna ports 407, in which the set of antennas 406 $_1$ to 406 $k$ can be part of the front end. In one aspect, the user equipment device 400 can comprise a phase locked loop system 410.

The processor 402 can confer functionality, at least in part, to substantially any electronic component within the mobile communication device 400, in accordance with aspects of the disclosure. As an example, the processor 400 can be configured to execute, at least in part, executable instructions that determine the instantaneous amplitude and frequency of the transmit signal and/or select the bias voltage as described in FIGS. 1-3. The processor 400 may embody various aspects of the frequency dependent envelope tracking circuitry, and so on, of FIGS. 1-2 as a multimode operation chipset that affords 2D envelope tracking for a transmitter or a receiver.

The processor 402 is functionally and/or communicatively coupled (e.g., through a memory bus) to memory 403 in order to store or retrieve information necessary to operate and confer functionality, at least in part, to communication platform or front end 404, the phase locked loop system 410 and substantially any other operational aspects of the phase locked loop system 410. The phase locked loop system 410 includes at least one oscillator (e.g., a VCO, DCO or the like) that can be calibrated via core voltage, a coarse tuning value, signal, word or selection process according the various aspects described herein.

The processor 402 can operate to enable the mobile communication device 400 to process data (e.g., symbols, bits, or chips) for multiplexing/demultiplexing with the mux/demux component 412, or modulation/demodulation via the mod/demod component 414, such as implementing direct and inverse fast Fourier transforms, selection of modulation rates, selection of data packet formats, interpacket times, etc. Memory 403 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an envelope tracking system, including an instantaneous frequency circuitry configured to determine an instantaneous frequency of a transmit signal and a two-dimensional (2D) bias voltage selection circuitry. The 2D bias voltage selection circuitry is configured to: determine a bias voltage based on both an instantaneous amplitude of the transmit signal and the instantaneous frequency of the transmit signal, and control power supply circuitry to provide the determined bias voltage to a power amplifier for amplification of the transmit signal.

Example 2 includes the subject matter of example 1, including or omitting optional elements, further including instantaneous amplitude circuitry that includes a Coordinate Rotation Digital Computer (CORDIC) configured to compute an amplitude of the transmit signal and to generate an amplitude signal that communicates the computed amplitude.

Example 3 includes the subject matter of example 1, including or omitting optional elements, wherein the instantaneous frequency circuitry includes a Coordinate Rotation Digital Computer (CORDIC) and a differentiator circuitry. The CORDIC is configured to compute a phase of the transmit signal and to generate a phase signal that communicates the computed phase. The differentiator circuitry is configured to generate an instantaneous frequency signal based on a rate of change of the phase signal, wherein the instantaneous frequency signal communicates the instantaneous frequency.

Example 4 includes the subject matter of examples 1-3, including or omitting optional elements, wherein the 2D bias voltage selection circuitry further includes a memory storing a lookup table (LUT) that maps instantaneous amplitude and instantaneous frequency value pairs to respective instantaneous bias voltages. The 2D bias voltage selection circuitry is further configured to select a bias voltage that is mapped to a present value of the instantaneous amplitude and the instantaneous frequency.

Example 5 includes the subject matter of examples 1-3, including or omitting optional elements, wherein the 2D bias voltage selection circuitry further includes combination circuitry and a memory. The combination circuitry is configured to combine a present value of the instantaneous amplitude and a present value of the instantaneous frequency to generate a combination value. The memory is configured to store a LUT that maps combination values to respective instantaneous bias voltages, wherein the 2D bias voltage selection circuitry is further configured to select a bias voltage that is mapped to a present value of the combination value.

Example 6 includes the subject matter of examples 1-3, including or omitting optional elements, further including memory configured to store a LUT and calibration circuitry. The calibration circuitry is configured to populate the LUT by supplying a test signal that varies in amplitude and frequency. For each of at least two combinations of amplitude values and frequency value, the calibration circuitry is configured to control the power supply circuitry to adjust the bias voltage to the power amplifier to obtain a desired gain; and record, in the LUT, the amplitude value and the frequency value mapped to the value of the bias voltage that obtains the desired gain.

Example 7 includes the subject matter example 6, including or omitting optional elements, wherein the calibration circuitry is configured to: interpolate, based at least on the amplitude values and the frequency values, an interpolated bias voltage value that is associated with an interpolated amplitude value and an interpolated frequency value; and record, in the LUT, the interpolated amplitude value and the interpolated frequency value mapped to the interpolated bias voltage value.

Example 8 is a method configured to control a power amplifier bias voltage based on an envelope of a transmit signal. The method includes receiving a transmit signal; determining an instantaneous amplitude of the transmit signal; determining an instantaneous frequency of the transmit signal; determining a bias voltage based on both the instantaneous amplitude and the instantaneous frequency of the transmit signal, and controlling power supply circuitry to provide the determined bias voltage to a power amplifier for amplification of the transmit signal.

Example 9 includes the subject matter of example 8, including or omitting optional elements, wherein determining the instantaneous amplitude includes: computing, with a Coordinate Rotation Digital Computer (CORDIC), an amplitude of the transmit signal; and generating an amplitude signal that communicates the computed amplitude.

Example 10 includes the subject matter of example 8, including or omitting optional elements, wherein determining the instantaneous frequency circuitry includes: computing, with a Coordinate Rotation Digital Computer (CORDIC), a phase of the transmit signal; generating a phase signal that communicates the computed phase; and generating an instantaneous frequency signal based on a rate of change of the phase signal, wherein the instantaneous frequency signal communicates the instantaneous frequency.

Example 11 includes the subject matter of examples 8-10, including or omitting optional elements, further including reading a stored a lookup table (LUT) that maps instantaneous amplitude and instantaneous frequency value pairs to respective instantaneous bias voltages; and selecting a bias voltage that is mapped to a present value of the instantaneous amplitude and the instantaneous frequency.

Example 12 includes the subject matter of examples 8-10, including or omitting optional elements, further including: combining a present value of the instantaneous amplitude and a present value of the instantaneous frequency to generate a combination value; reading a stored LUT that maps combination values to respective instantaneous bias voltages; and selecting a bias voltage that is mapped to a present value of the combination value.

Example 13 includes the subject matter of examples 8-10, including or omitting optional elements, further including populating a LUT by: supplying a test signal that varies in amplitude and frequency; for each of at least two combinations of amplitude values and frequency value: controlling the power supply circuitry to adjust the bias voltage to the power amplifier to obtain a desired gain; and recording, in the LUT, the amplitude value and the frequency value mapped to the value of the bias voltage that obtains the desired gain; and storing the populated LUT.

Example 14 includes the subject matter of example 13, including or omitting optional elements, further including: interpolating, based at least on the amplitude values and the frequency values, an interpolated bias voltage value that is associated with an interpolated amplitude value and an interpolated frequency value; and recording, in the LUT, the interpolated amplitude value and the interpolated frequency value mapped to the interpolated bias voltage value.

Example 15 is a transmitter, including a transmit chain and a two-dimensional (2D) bias voltage selection circuitry. The transmit chain is configured to process a transmit baseband signal to generate a transmit radio frequency (RF) signal, wherein the transmit chain includes a power amplifier that amplifies the transmit RF signal to generate an uplink signal. The 2D bias voltage selection circuitry is configured to: determine a bias voltage based on both an instantaneous amplitude and an instantaneous frequency of the transmit baseband signal, and control power supply circuitry to provide the determined bias voltage to a power amplifier for amplification of the transmit signal.

Example 14 includes the subject matter of example 13, including or omitting optional elements, further including an instantaneous amplitude circuitry configured to determine the instantaneous amplitude of the transmit signal.

Example 15 includes the subject matter of example 16, including or omitting optional elements, wherein the instantaneous amplitude circuitry includes a Coordinate Rotation Digital Computer (CORDIC) configured to compute an amplitude of the transmit signal and to generate an amplitude signal that communicates the computed amplitude.

Example 18 includes the subject matter of example 15, including or omitting optional elements, further including an instantaneous frequency circuitry configured to determine the instantaneous frequency of the transmit signal.

Example 19 includes the subject matter of examples 15-18, including or omitting optional elements, wherein the instantaneous frequency circuitry includes: a Coordinate Rotation Digital Computer (CORDIC) configured to compute a phase of the transmit signal and to generate a phase signal that communicates the computed phase; and a differentiator circuitry configured to generate an instantaneous frequency signal based on a rate of change of the phase signal, wherein the instantaneous frequency signal communicates the instantaneous frequency.

Example 20 includes the subject matter of examples 15-18, including or omitting optional elements, wherein the 2D bias voltage selection circuitry further includes a memory configured to store a lookup table (LUT) that maps instantaneous amplitude and instantaneous frequency value pairs to respective instantaneous bias voltages, wherein the 2D bias voltage selection circuitry is further configured to select a bias voltage that is mapped to a present value of the instantaneous amplitude and the instantaneous frequency.

Example 21 includes the subject matter of examples 15-18, including or omitting optional elements, wherein the 2D bias voltage selection circuitry further includes: a combination circuitry configured to combine a present value of the instantaneous amplitude and a present value of the instantaneous frequency to generate a combination value; and a memory configured to store a LUT that maps combination values to respective instantaneous bias voltages, wherein the 2D bias voltage selection circuitry is further configured to select a bias voltage that is mapped to a present value of the combination value.

Example 22 includes the subject matter of examples 15-18, including or omitting optional elements, further including a memory configured to store a LUT and calibration circuitry. The calibration circuitry is configured to populate the LUT by supplying a test signal that varies in amplitude and frequency. The calibration circuitry is configured to, for each of at least two combinations of amplitude values and frequency value: control the power supply circuitry to adjust the bias voltage to the power amplifier to obtain a desired gain; and record, in the LUT, the amplitude value and the frequency value mapped to the value of the bias voltage that obtains the desired gain.

Example 23 includes the subject matter of example 22, including or omitting optional elements, wherein the calibration circuitry is configured to: interpolate, based at least on the amplitude values and the frequency values, an interpolated bias voltage value that is associated with an interpolated amplitude value and an interpolated frequency value; and record, in the LUT, the interpolated amplitude value and the interpolated frequency value mapped to the interpolated bias voltage value.

Example 24 is an apparatus, including: means for determining an instantaneous amplitude of the transmit signal; means for determining an instantaneous frequency of the transmit signal; means for selecting a bias voltage based on both the instantaneous amplitude and the instantaneous frequency of the transmit signal, and means for controlling power supply circuitry to supply the selected bias voltage to a power amplifier that is configured to amplify the transmit signal.

Example 25 includes the subject matter of example 24, including or omitting optional elements, wherein the means for determining an instantaneous frequency includes: means for computing a phase of the transmit signal; means for generating a phase signal that communicates the computed phase; and means for generating an instantaneous frequency signal based on a rate of change of the phase signal, wherein the instantaneous frequency signal communicates the instantaneous frequency.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. An envelope tracking system, comprising:
   memory configured to store bias voltages mapped to respective pairs of instantaneous amplitude and instantaneous frequency;
   an instantaneous amplitude circuitry configured to determine an instantaneous amplitude of a transmit signal;
   an instantaneous frequency circuitry configured to:
   determine a phase of the transmit signal; and
   determine an instantaneous frequency of the transmit signal based on the determined phase of the transmit signal; and
   a two-dimensional (2D) bias voltage selection circuitry configured to:

access the memory to determine a bias voltage that is mapped to the determined instantaneous amplitude and the determined instantaneous frequency; and control power supply circuitry to provide the determined bias voltage to a power amplifier for amplification of the transmit signal.

2. The envelope tracking system of claim 1, wherein the instantaneous amplitude circuitry includes a Coordinate Rotation Digital Computer (CORDIC) configured to determine the instantaneous amplitude of the transmit signal and to generate an instantaneous amplitude signal that communicates the determined instantaneous amplitude.

3. The envelope tracking system of claim 1, wherein the instantaneous frequency circuitry comprises:

a Coordinate Rotation Digital Computer (CORDIC) configured to determine the phase of the transmit signal and to generate a phase signal that communicates the determined phase; and a differentiator circuitry configured to generate an instantaneous frequency signal based on a rate of change of the phase signal, wherein the instantaneous frequency signal communicates the instantaneous frequency.

4. The envelope tracking system of claim 1, wherein the memory is configured to store a lookup table (LUT) that maps instantaneous amplitude and instantaneous frequency value pairs to respective bias voltages.

5. The envelope tracking system of claim 1, wherein the 2D bias voltage selection circuitry further comprises:

a combination circuitry configured to combine the instantaneous amplitude and the instantaneous frequency to generate a combination value; and wherein the memory is configured to store a LUT that maps combination values, wherein each combination value comprises a combination of the instantaneous amplitude and instantaneous frequency in a pair to respective bias voltages, wherein the 2D bias voltage selection circuitry is further configured to select a bias voltage that is mapped to a present value of the combination value.

6. The envelope tracking system of claim 1, wherein the memory is configured to store a LUT and the envelope tracking system further comprises:

calibration circuitry configured to populate the LUT by:
supplying a test signal that varies in amplitude and frequency;
for each of at least two combinations of amplitude value and frequency value:
controlling the power supply circuitry to adjust the bias voltage to the power amplifier to obtain a desired gain; and
recording, in the LUT, the amplitude value and the frequency value mapped to the value of the bias voltage that obtains the desired gain.

7. The envelope tracking system of claim 6 wherein the calibration circuitry is configured to:

interpolate, based at least on the amplitude values and the frequency values, an interpolated bias voltage value that is associated with an interpolated amplitude value and an interpolated frequency value; and record, in the LUT, the interpolated amplitude value and the interpolated frequency value mapped to the interpolated bias voltage value.

8. A method configured to control a power amplifier bias voltage based on an envelope of a transmit signal, comprising:

providing a memory configured to store bias voltages mapped to respective pairs of instantaneous amplitude and instantaneous frequency;

receiving a transmit signal;

determining an instantaneous amplitude of the transmit signal;

determining a phase of the transmit signal;

determining an instantaneous frequency of the transmit signal based on the determined phase of the transmit signal;

accessing the memory to determine a bias voltage that is mapped to the determined instantaneous amplitude and the determined instantaneous frequency; and controlling power supply circuitry to provide the determined bias voltage to a power amplifier for amplification of the transmit signal.

9. The method of claim 8, wherein determining the instantaneous amplitude comprises:

determining, with a Coordinate Rotation Digital Computer (CORDIC), an instantaneous amplitude of the transmit signal; and generating an amplitude signal that communicates the determined instantaneous amplitude.

10. The method of claim 8, wherein:

determining the phase of the transmit signal comprises, with a Coordinate Rotation Digital Computer (CORDIC),
determining a phase of the transmit signal; and
generating a phase signal that communicates the determined phase; and determining an instantaneous frequency of the transmit signal based on the determined phase of the transmit signal comprises, with the CORDIC,
determining the instantaneous frequency by determining a rate of change of the phase signal; and
generating an instantaneous frequency signal that communicates the instantaneous frequency.

11. The method of claim 8, further comprising:

providing the memory with bias voltages mapped to respective combination values, wherein a combination value comprises a combination of an instantaneous amplitude and an instantaneous frequency in a pair;

combining the instantaneous amplitude and the instantaneous frequency to generate a combination value; and reading a the memory to determine the bias voltage mapped to the combination value.

12. The method of claim 8, further comprising:

populating a LUT that is stored in the memory by:
supplying a test signal that varies in amplitude and frequency;
for each of at least two combinations of amplitude value and frequency value:
controlling the power supply circuitry to adjust the bias voltage to the power amplifier to obtain a desired gain; and
recording, in the LUT, the amplitude value and the frequency value mapped to the value of the bias voltage that obtains the desired gain; and storing the populated LUT.

13. The method of claim 12, further comprising:

interpolating, based at least on the amplitude values and the frequency values, an interpolated bias voltage value that is associated with an interpolated amplitude value and an interpolated frequency value; and recording, in the LUT, the interpolated amplitude value and the interpolated frequency value mapped to the interpolated bias voltage value.

14. A transmitter, comprising:
a transmit chain configured to process a transmit baseband signal to generate a transmit radio frequency (RF) signal, wherein the transmit chain includes a power amplifier that amplifies the transmit RF signal to generate an uplink signal;
memory configured to store bias voltages mapped to respective pairs of instantaneous amplitude and instantaneous frequency;
an instantaneous amplitude circuitry configured to determine an instantaneous amplitude of the transmit RF signal;
an instantaneous frequency circuitry configured to:
determine a phase of the transmit RF signal; and
determine an instantaneous frequency of the transmit RF signal based on the determined phase of the transmit baseband signal; and
a two-dimensional (2D) bias voltage selection circuitry configured to:
access the memory to determine a bias voltage that is mapped to the determined instantaneous amplitude and the determined instantaneous frequency; and
control power supply circuitry to provide the determined bias voltage to the power amplifier.

15. The transmitter of claim 14, wherein the instantaneous amplitude circuitry comprises a Coordinate Rotation Digital Computer (CORDIC) configured to determine the instantaneous amplitude of the transmit baseband signal and to generate an instantaneous amplitude signal that communicates the determined instantaneous amplitude.

16. The transmitter of claim 14, wherein the instantaneous frequency circuitry comprises:
a Coordinate Rotation Digital Computer (CORDIC) configured to determine the phase of the transmit baseband signal and to generate a phase signal that communicates the determined phase; and
a differentiator circuitry configured to generate an instantaneous frequency signal based on a rate of change of the phase signal, wherein the instantaneous frequency signal communicates the instantaneous frequency.

17. The transmitter of claim 14, wherein the memory is configured to store a lookup table (LUT) that maps instantaneous amplitude and instantaneous frequency value pairs to respective bias voltages.

18. The transmitter of claim 14, wherein the 2D bias voltage selection circuitry further comprises:
a combination circuitry configured to combine the instantaneous amplitude and the instantaneous frequency to generate a combination value; and
wherein the memory is configured to store a LUT that maps combination values comprising a combination of an instantaneous amplitude and an instantaneous frequency in a pair to respective bias voltages, wherein the 2D bias voltage selection circuitry is further configured to select a bias voltage that is mapped to the combination value.

19. The transmitter of claim 14, wherein the memory is configured to store a LUT and the transmitter further comprises calibration circuitry configured to populate the LUT by:
supplying a test signal that varies in amplitude and frequency;
for each of at least two combinations of amplitude values and frequency value:
controlling the power supply circuitry to adjust the bias voltage to the power amplifier to obtain a desired gain; and
recording, in the LUT, the amplitude value and the frequency value mapped to the value of the bias voltage that obtains the desired gain.

20. The transmitter of claim 19, wherein the calibration circuitry is configured to:
interpolate, based at least on the amplitude values and the frequency values, an interpolated bias voltage value that is associated with an interpolated amplitude value and an interpolated frequency value; and
record, in the LUT, the interpolated amplitude value and the interpolated frequency value mapped to the interpolated bias voltage value.

* * * * *